United States Patent
Hung et al.

(10) Patent No.: US 7,509,615 B2
(45) Date of Patent: Mar. 24, 2009

(54) CIRCUIT LAYOUT STRUCTURE AND METHOD

(75) Inventors: Chih-Chien Hung, Hsinchu (TW); Ming-Che Wu, Miaoli County (TW)

(73) Assignee: Realtek Semiconductor Corp., Hsinchu (TW)

( * ) Notice: Subject to any disclaimer, the term of this patent is extended or adjusted under 35 U.S.C. 154(b) by 522 days.

(21) Appl. No.: 11/281,477

(22) Filed: Nov. 18, 2005

(65) Prior Publication Data
US 2006/0108694 A1    May 25, 2006

(30) Foreign Application Priority Data
Nov. 19, 2004    (TW) ............... 93135763 A

(51) Int. Cl.
G06F 17/50    (2006.01)
H01L 23/48    (2006.01)
H01L 23/52    (2006.01)

(52) U.S. Cl. ............... 716/12; 716/13; 716/14; 257/773; 257/776

(58) Field of Classification Search ............. 716/12–14; 257/773, 776
See application file for complete search history.

(56) References Cited

U.S. PATENT DOCUMENTS

| 5,723,908 A | * | 3/1998 | Fuchida et al. ............. 257/758 |
| 2005/0120316 A1 | * | 6/2005 | Suaya et al. ................... 716/4 |

* cited by examiner

*Primary Examiner*—Vuthe Siek
*Assistant Examiner*—Magid Y Dimyan
(74) *Attorney, Agent, or Firm*—Bacon & Thomas, PLLC

(57) ABSTRACT

A symmetrical circuit layout structure includes a number of signal wires, a ground wire and a dielectric layer. The signal wires include a first portion placed on a first plane and a second portion placed on a second plane. The ground wire includes a first portion placed above the first portion of the signal wires and adjacent to the second portion of the signal wires, and a second portion placed below the second portion of the signal wires and adjacent to the first portion of the signal wires. The dielectric layer is placed between the first plane and the second plane.

19 Claims, 5 Drawing Sheets

CIRCUIT LAYOUT STRUCTURE AND METHOD

This application claims the benefit of Taiwan application Serial No. 93135763, filed Nov. 19, 2004, the subject matter of which is incorporated herein by reference.

BACKGROUND OF THE INVENTION

1. Field of the Invention

The invention relates in general to a field of circuit layout, and more particularly to a symmetrical circuit layout structure and method.

2. Description of the Related Art

Recently, electrical products tend to have higher efficiency and smaller sizes. Thus, the electrical devices tend to be mounted in these electrical products in a denser manner. In order to mount the electrical devices in a denser manner, bare semiconductor chips are often mounted to a surface of a circuit layout board (PCB) in a flip-chip mounting manner. Specifically speaking, it is preferred to use a multi-layer circuit layout board to obtain the advantage of the high-density circuit layout because a semiconductor chip has a lot of connector pins. The semiconductor package, which may include the semiconductor chip, is an essential component in the electric circuit and is thus mounted on a PCB. The PCB may also be a multi-layer circuit layout board such that the high density circuit layout may be achieved.

FIG. 1A is a schematic diagram showing a conventional circuit layout structure. The circuit layout of FIG. 1A has the problem of electric characteristic asymmetry.

FIG. 1B is a schematic diagram showing another conventional circuit layout structure, wherein a number of ground wires and a number of signal wires are placed on the same metal layer, and the signal wires transmit several pairs of differential signals with the phase difference of 180 degrees. The circuit layout structure, which looks like a symmetrical structure, has the drawback of the enlarged area when the numbers of the signal wires and ground wires are increased.

SUMMARY OF THE INVENTION

It is therefore an object of the invention to provide a circuit layout structure and method capable of solving the symmetrical circuit layout problem in the integrated circuit (IC) design.

Another object of the invention is to provide a circuit layout structure and method capable of solving the symmetrical circuit layout problem in the printed circuit board (PCB) design.

The invention achieves the above-identified objects by providing a symmetrical circuit layout method, which includes the steps of: forming a first and a second portions of a plurality of signal wires on a first and a second planes, respectively; forming a first and a second portions of a ground wire on the first and the second planes, respectively; coupling the first portion of the signal wires to the second portion of the signal wires, respectively; and coupling the first portion of the ground wire to the second portion of the ground wire.

The invention also achieves the above-identified objects by providing a symmetrical circuit layout structure, which includes: a plurality of signal wires, each the signal wires comprising: a first and a second portions, placed on a first and a second planes, respectively; and a ground wire, comprising: a first portion, placed over the first portion of the signal wires and adjacent to the second portion of the signal wires; and a second portion, placed below the second portion of the signal wires and adjacent to the first portion of the signal wires.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
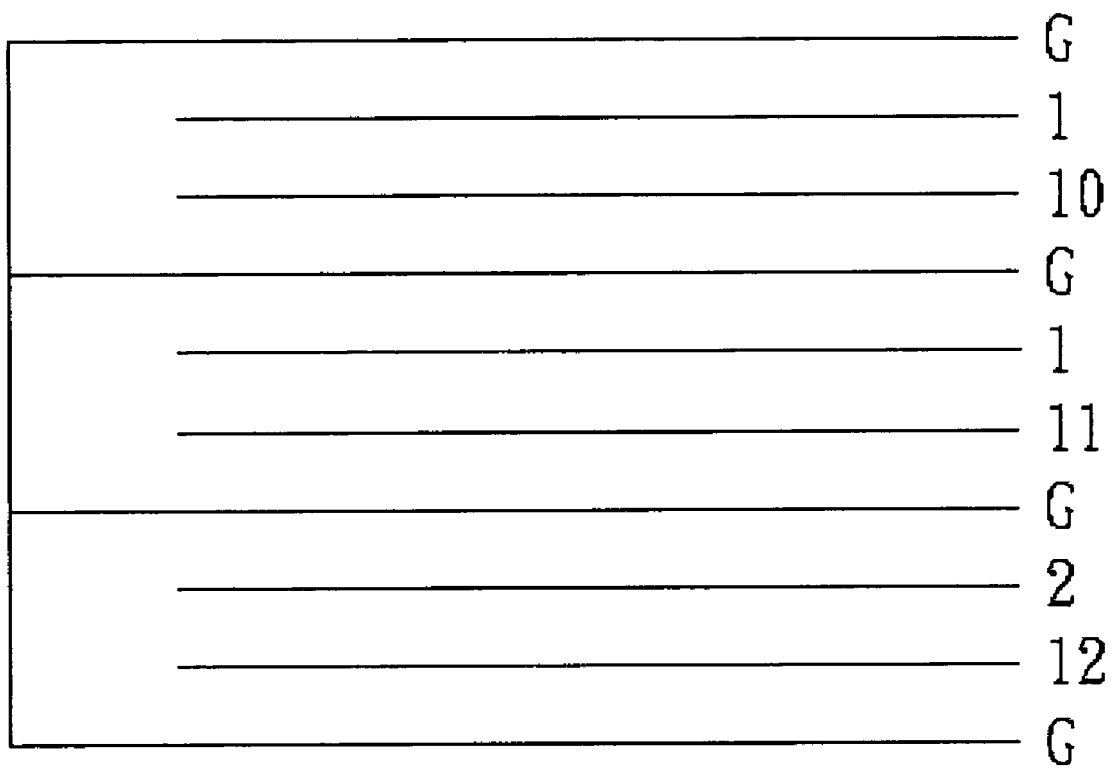
FIG. 1A is a schematic diagram showing a conventional circuit layout structure.
Figure 1B:
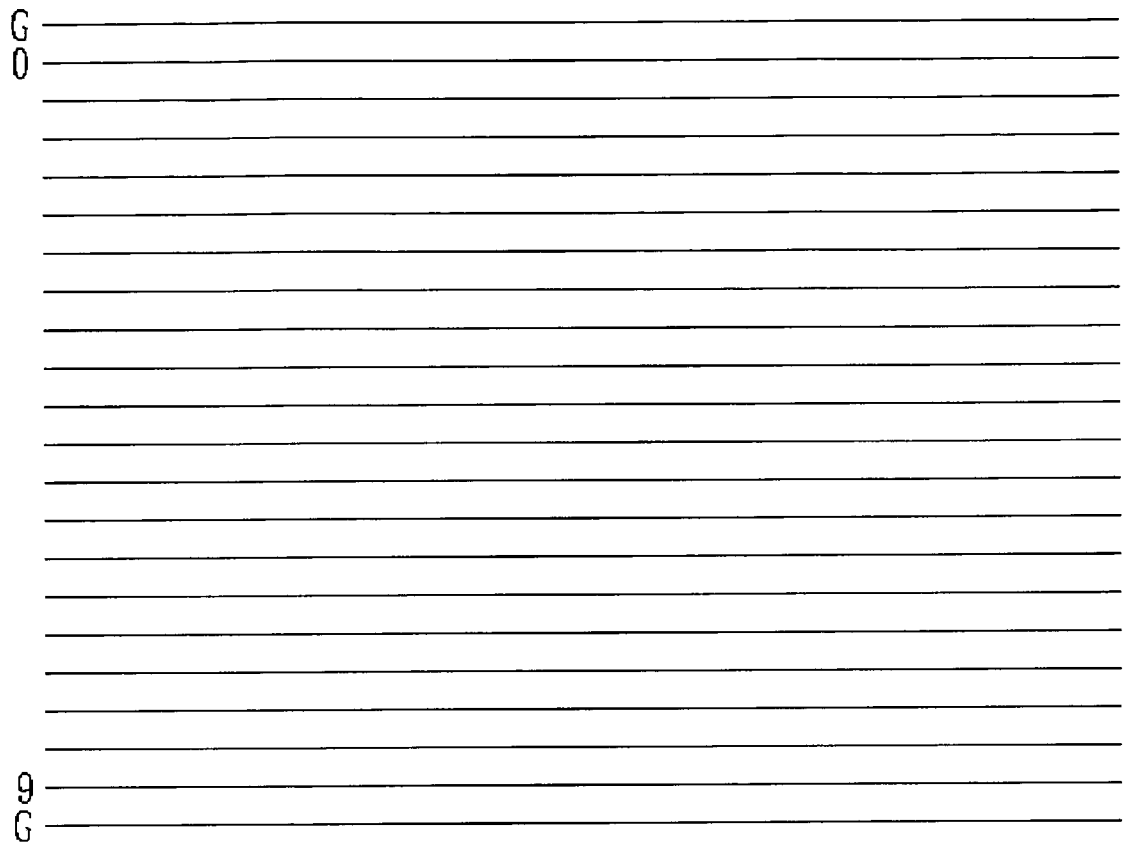
FIG. 1B is a schematic diagram showing another conventional circuit layout structure.
Figure 2:
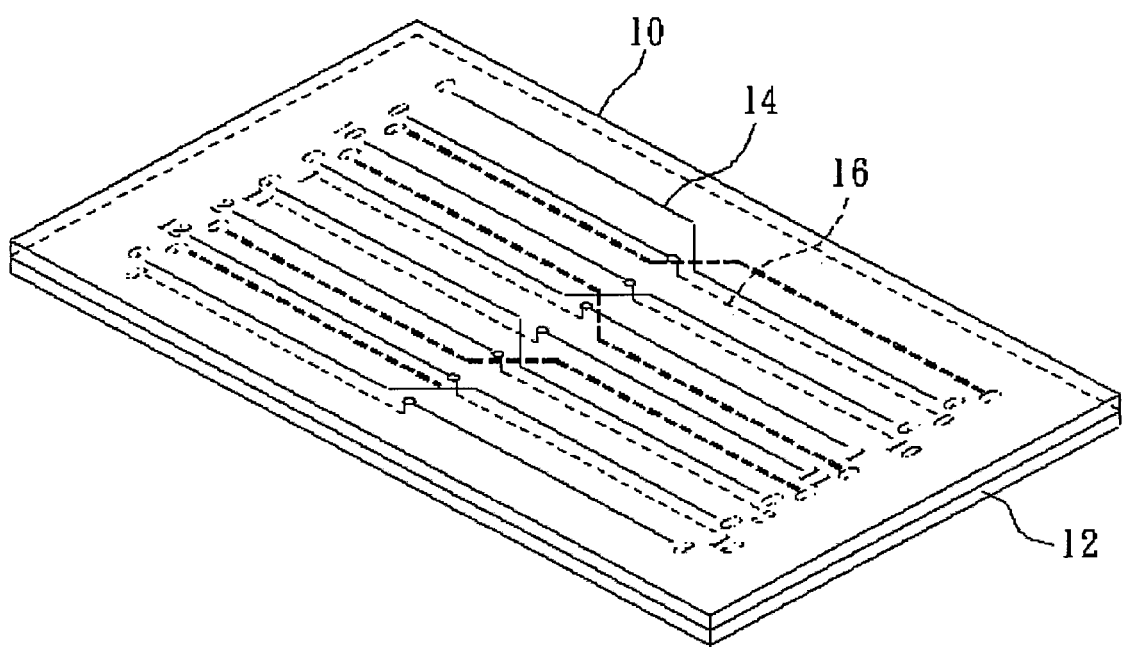
FIG. 2 shows a symmetrical circuit layout structure according to a first embodiment of the invention.

FIG. 2 shows a symmetrical circuit layout structure according to a first embodiment of the invention. As shown in FIG. 2, the structure is placed in an integrated circuit (IC) or a printed circuit board (PCB) and includes a plurality of signal wires 16, a ground wire 14, and a dielectric layer. The signal wires 16 include a first portion placed on a first plane 10 and a second portion placed on a second plane 12. The ground wire 14 is placed between the signal wires and includes a first portion and a second portion. The first portion of the ground wire 14 is placed above the first portion of the signal wires and adjacent to the second portion of the signal wires. The ground wire of the second plane is coupled to the ground wire of the first plane. The second portion of the ground wire is placed below the second portion of the signal wires and adjacent to the first portion of the signal wires. The dielectric layer is disposed between the first plane and the second plane. The signal wires are adjacent to the ground wire such that the electric properties of the signal wires are substantially the same. Each signal wire includes a first signal wire and a second signal wire for transmitting a differential signal.

In the first embodiment, the first plane is substantially parallel to the second plane, and the first plane and the second plane include a plurality of signal wires and a ground wire. The signal wires are adjacent to the ground wire such that the electric characteristics of the signal wires are substantially the same. The signal wire of the first plane substantially overlays with the ground wire of the second plane, and the signal wire of the second plane substantially overlays with the ground wire of the first plane.

Figure 3:
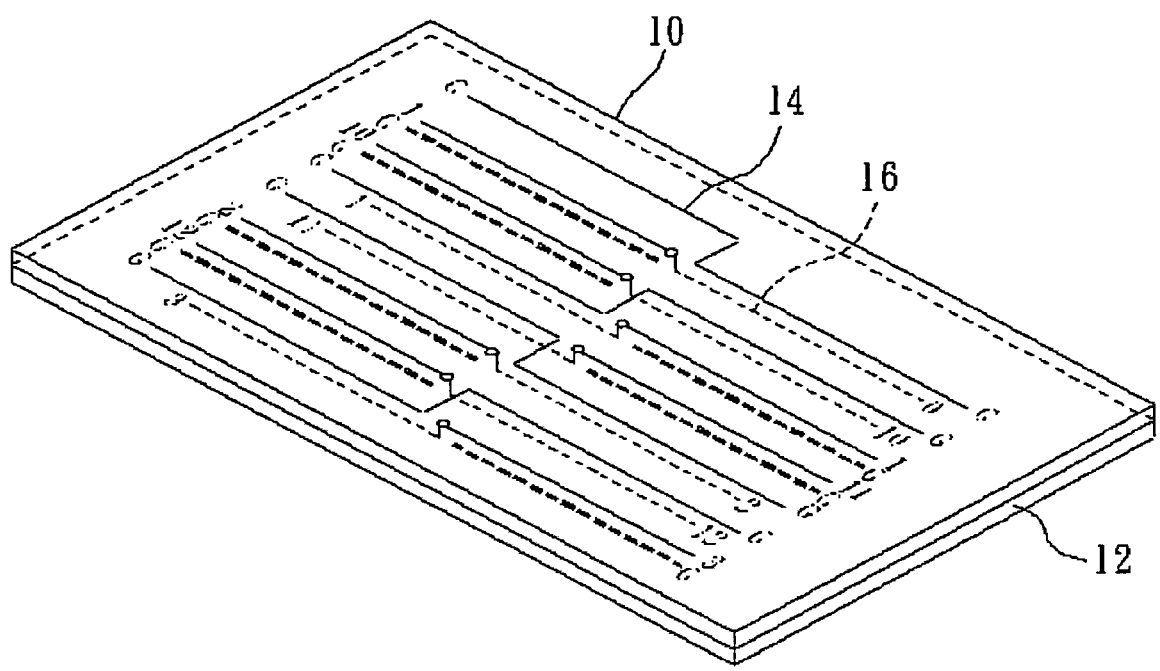
FIG. 3 shows a symmetrical circuit layout structure according to a second embodiment of the invention.

FIG. 3 shows a symmetrical circuit layout structure according to a second embodiment of the invention. What is different from the first embodiment is that the symmetrical circuit layout structure of the second embodiment has a plurality of ladder-like ground wires symmetrically placed on the first metal layer.

Figure 4:
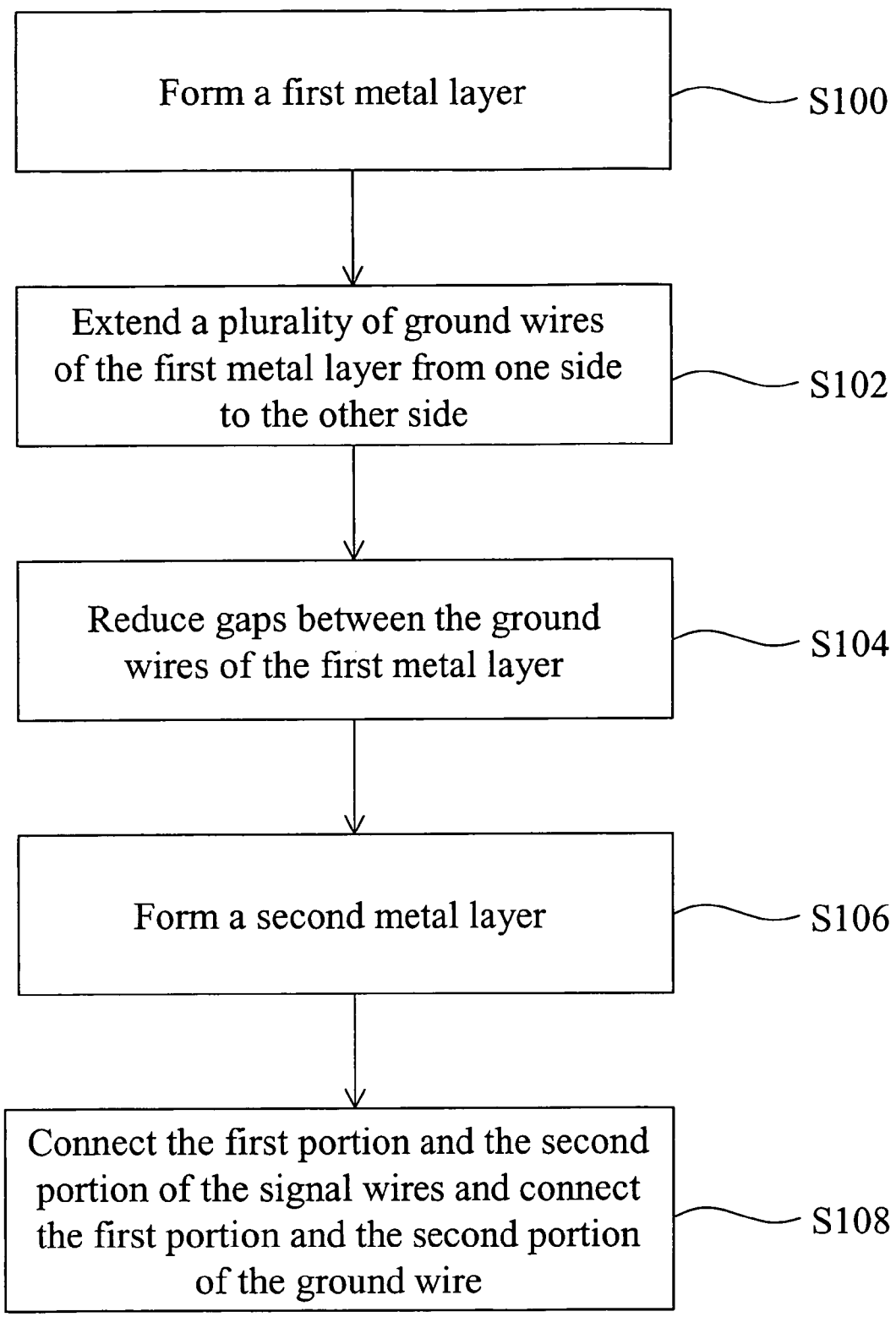
FIG. 4 is a flow chart showing a symmetrical circuit layout method of the invention.

FIG. 4 is a flow chart showing a symmetrical circuit layout method of the invention. The method includes a step S100 of forming a first portion of a plurality of signal wires on a first plane, and a step S102 of forming a first portion of a ground wire on the first plane. The signal wires are adjacent to the ground wire such that the electric properties of the signal wires are substantially the same. The ground wire is placed between the signal wires. Each of the signal wires includes a first signal wire and a second signal wire for transmitting a differential signal. The method further includes a step S104 of forming a second portion of the signal wires on a second plane, and a step S106 of forming a second portion of the ground wire on the second plane. The second portion of the signal wire substantially overlays with the first portion of the ground wire. The method further includes a step S108 of connecting the first portion of the signal wires to the second portion of the signal wires, and connecting the first portion of the ground wire to the second portion of the ground wire. The first portion of the signal wire substantially overlays with the second portion of the ground wire and the signal wires are adjacent to the ground wire.

Two metal layers are used in this invention, and the signal wires of the second metal layer are correspondingly placed above the ground wire of the first metal layer. That is, when viewing from the signal wires of the second metal layer vertically downwards, it can see the ground wire of the first metal layer, and the ground wire of the first metal layer may be placed between the signal wires of the second metal layer. That is, when viewing from the middle between the signal wires of the second metal layer vertically downward, it can see the ground wire of the first metal layer. In an embodiment, the ground wires of the first metal layer and the second metal layer are in a common circuit layout.

In practice, the invention can reduce the circuit layout area and can be used in a phase interpolation symmetrical circuit layout structure for a phase-locked loop circuit (output/input), a symmetrical circuit layout structure for a voltage controlled oscillator, or a multi-phase symmetrical circuit layout structure for a bus.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A symmetrical circuit layout method, comprising the steps of:
    forming a first portion of a plurality of signal wires on a first plane;
    forming a first portion of a ground wire on the first plane;
    forming a second portion of the plurality of signal wires on a second plane;
    forming a second portion of the ground wire on the second plane;
    coupling the first portion of the plurality of signal wires to the second portion of the plurality of signal wires, respectively; and
    coupling the first portion of the ground wire to the second portion of the ground wire,
    wherein the signal wires are adjacent to the ground wire, and the first portion of the plurality of signal wires is substantially over the second portion of the around wire.

2. The method of claim 1, wherein the signal wires are adjacent to the ground wire such that electric properties of the signal wires are substantially the same.

3. The method of claim 1, wherein each of the signal wires comprises a first signal wire and a second signal wire, for transmitting a differential signal.

4. The method of claim 1, wherein the ground wire is placed between the signal wires.

5. The method of claim 1, wherein the first portion of the ground wire is substantially over the second portion of the plurality of signal wires.

6. A symmetrical circuit layout structure, comprising:
    a plurality of signal wires, comprising:
        a first portion, placed on a first plane; and
        a second portion, placed on a second plane;
        a ground wire, comprising:
    a first portion, placed above the first portion of the plurality of signal wires and adjacent to the second portion of the plurality of signal wires; and
    a second portion, placed below the second portion of the plurality of signal wires and adjacent to the first portion of the plurality of signal wires; and
    a dielectric layer, placed between the first plane and the second plane.

7. The structure of claim 6, wherein the signal wires are adjacent to the ground wire such that electric properties of the signal wires are substantially the same.

8. The structure of claim 6, wherein each of the signal wires comprises a first signal wire and a second signal wire for transmitting a differential signal.

9. The structure of claim 6, wherein the ground wire of the second plane is coupled to the ground wire of the first plane.

10. The structure of claim 6, wherein the ground wire is placed between the signal wires.

11. The structure of claim 6 being placed in an integrated circuit (IC).

12. The structure of claim 6 being placed in a printed circuit board (PCB).

13. The structure of claim 6, wherein a length of the first portion of the plurality of signal wires and that of the second portion of the plurality of signal wires are substantially the same.

14. The structure of claim 6, wherein a length of each the signal wire is substantially the same.

15. A symmetrical circuit layout structure, comprising:
    a first plane and a second plane, substantially parallel to each other; and
    a dielectric layer, placed between the first plane and the second plane;
    wherein each of the planes comprises a plurality of signal wires and a ground wire, and the plurality of signal wires are adjacent to the ground wire such that electric properties of the plurality of signal wires are substantially the same;
    wherein the plurality of signal wires of the first plane substantially are over the ground wire of the second plane, and the ground wire of the first plane substantially is over the plurality of signal wires of the second plane.

16. The structure of claim 15, wherein each of the signal wires comprises a first signal wire and a second signal wire for transmitting a differential signal.

17. The structure of claim 15, wherein the ground wire of the second plane is coupled to the ground wire of the first plane.

18. The structure of claim 15, wherein the ground wire is placed between the signal wires.

19. The structure of claim 15 being placed in an integrated circuit (IC).

* * * * *